United States Patent
Wu et al.

(10) Patent No.: US 10,566,565 B2
(45) Date of Patent: Feb. 18, 2020

(54) ORGANIC LIGHT EMITTING DEVICE AND METHOD OF FABRICATING THE SAME, AND DISPLAY DEVICE

(71) Applicants: BOE TECHNOLOGY GROUP CO., LTD., Beijing (CN); Ordos Yuansheng Optoelectronics Co., Ltd., Ordos, Inner Mongolia (CN)

(72) Inventors: Haidong Wu, Beijing (CN); Weilin Lai, Beijing (CN); Kai Chen, Beijing (CN); Juanjuan Bai, Beijing (CN); Wenyu Ma, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 232 days.

(21) Appl. No.: 15/320,130

(22) PCT Filed: Jan. 27, 2016

(86) PCT No.: PCT/CN2016/072294
§ 371 (c)(1),
(2) Date: Dec. 19, 2016

(87) PCT Pub. No.: WO2017/036084
PCT Pub. Date: Mar. 9, 2017

(65) Prior Publication Data
US 2017/0194589 A1   Jul. 6, 2017

(30) Foreign Application Priority Data

Aug. 28, 2015  (CN) .......................... 2015 1 0542671

(51) Int. Cl.
*H01L 51/50*   (2006.01)
*H01L 51/52*   (2006.01)
*H01L 51/00*   (2006.01)

(52) U.S. Cl.
CPC .......... *H01L 51/5072* (2013.01); *H01L 51/50* (2013.01); *H01L 51/508* (2013.01);
(Continued)

(58) Field of Classification Search
CPC ....... H01L 2051/0063; H01L 2251/301; H01L 2251/55; H01L 2251/558; H01L 51/005;
(Continued)

(56) References Cited

U.S. PATENT DOCUMENTS 6,566,807 B1 *   5/2003   Fujita .................. H01L 51/5012
                                                  313/504
2003/0152801 A1 *   8/2003   Liao .................... H01L 51/5092
                                                  428/690

(Continued)

FOREIGN PATENT DOCUMENTS

CN   1190322 A   8/1998
CN   1261761 A   8/2000

(Continued)

OTHER PUBLICATIONS

International Search Report dated May 26, 2016 corresponding to application No. PCT/CN2016/072294.

(Continued)

*Primary Examiner* — Dawn L Garrett
(74) *Attorney, Agent, or Firm* — Nath, Goldberg & Meyer; Joshua B. Goldberg; Daniel Bissing

(57) ABSTRACT

The application provides an organic light emitting device, a method of fabricating the organic light emitting device, and a display device. The organic light emitting device comprises an anode layer, a cathode layer, and a light emitting (Continued)

layer provided between the anode layer and the cathode layer, and further comprises a carrier velocity adjustment layer provided between the light emitting layer and at least one of the anode layer and the cathode layer, and the carrier velocity adjustment layer is used for adjusting an injection rate of a carrier.

21 Claims, 3 Drawing Sheets

(52) U.S. Cl.
CPC ...... *H01L 51/5056* (2013.01); *H01L 51/5064* (2013.01); *H01L 51/5088* (2013.01); *H01L 51/5092* (2013.01); *H01L 51/5206* (2013.01); *H01L 51/5221* (2013.01); *H01L 51/005* (2013.01); *H01L 51/007* (2013.01); *H01L 51/0037* (2013.01); *H01L 51/0059* (2013.01); *H01L 51/0067* (2013.01); *H01L 51/0072* (2013.01); *H01L 2051/0063* (2013.01); *H01L 2251/301* (2013.01); *H01L 2251/55* (2013.01); *H01L 2251/558* (2013.01)

(58) Field of Classification Search
CPC ............. H01L 51/0059; H01L 51/0067; H01L 51/007; H01L 51/0072; H01L 51/50; H01L 51/5056; H01L 51/5072; H01L 51/5088; H01L 51/5092; H01L 51/5206; H01L 51/5221
See application file for complete search history.

(56) References Cited

U.S. PATENT DOCUMENTS

| | | | |
|---|---|---|---|
| 2003/0224203 A1* | 12/2003 | Raychaudhuri | H01L 51/5092 428/690 |
| 2005/0067638 A1 | 3/2005 | Gupta et al. | |
| 2005/0069727 A1 | 3/2005 | Gupta et al. | |
| 2005/0249974 A1 | 11/2005 | Mori et al. | |
| 2005/0264174 A1* | 12/2005 | Liao | H01L 51/5278 313/500 |
| 2009/0110957 A1* | 4/2009 | Begley | C07C 13/66 428/690 |

FOREIGN PATENT DOCUMENTS

| | | |
|---|---|---|
| CN | 1564638 A | 1/2005 |
| CN | 1586095 A | 2/2005 |
| CN | 101101974 A | 1/2008 |
| CN | 101159315 A | 4/2008 |
| CN | 101400757 A | 4/2009 |
| CN | 101436646 A | 5/2009 |
| CN | 102881843 A | 1/2013 |
| CN | 103378297 A | 10/2013 |
| CN | 103730587 A | 4/2014 |
| CN | 104064675 A | 9/2014 |
| CN | 104183761 A | 12/2014 |
| CN | 104600201 A | 5/2015 |
| CN | 104638197 A | 5/2015 |
| CN | 105244446 A | 1/2016 |
| JP | H03105896 A | 5/1991 |
| WO | 00/57446 A1 | 9/2000 |
| WO | 0065879 A1 | 11/2000 |
| WO | 2013/032304 A2 | 3/2013 |

OTHER PUBLICATIONS

First Office Action dated Nov. 28, 2016 corresponding to Chinese application No. 201510542671.5.
Chen, Chieh-Wei, et al."An Effective Cathode Structure for Inverted Top-Emitting Organic Light-Emitting Devices"; Applied Physics Letters; Sep. 27, 2004; vol. 85; No. 13.
Extended European Search Report dated Apr. 15, 2019 issued in corresponding European Application No. 16812665.4.

* cited by examiner

ORGANIC LIGHT EMITTING DEVICE AND METHOD OF FABRICATING THE SAME, AND DISPLAY DEVICE

CROSS-REFERENCE TO RELATED APPLICATION

This is a National Phase Application filed under 35 U.S.C. 371 as a national stage of PCT/CN2016/072294 filed on Jan. 27, 2016, an application claiming the benefit of Chinese application No. 201510542671.5 filed on Aug. 28, 2015, the content of each of which is hereby incorporated by reference in its entirety.

TECHNICAL FIELD

The application relates to the field of display technology, particularly to an organic light emitting device, a method of fabricating the organic light emitting device, and a display device.

BACKGROUND

An organic light emitting device (referred to as OLED) is a light emitting device using an organic solid semiconductor as a light emitting material, and has a broad application prospect due to its advantages of simple fabricating process, low cost, low power consumption, high luminous brightness, wide range of operating temperature, etc.

A structure of an existing OLED generally comprises an anode layer, a cathode layer, and an organic function layer provided between the anode layer and the cathode layer. The organic function layer comprises a hole injection layer, a hole transport layer, a light emitting layer, an electron transport layer and an electron injection layer, which are sequentially provided in a direction from the anode layer to the cathode layer. The hole injection layer is adjacent to the anode layer, and the electron injection layer is adjacent to the cathode layer.

A light emitting mechanism of the OLED is as follows. When an external voltage is applied between the anode layer and the cathode layer, driven by the external voltage, the holes injected from the anode layer enters the light emitting layer through the hole injection layer and the hole transport layer, and the electrons injected from the cathode layer enters the light emitting layer through the electron injection layer and the electron transport layer. The holes and the electrons which have entered the light emitting layer recombine to form excitons in a recombination region, and the excitons emit light by radiative transition, thereby resulting in light-emitting phenomenon, i.e., electroluminescence.

The inventor finds at least the following problems that exist in the prior art. Since the electrons and the holes have different injection rates, i.e., the injection rate of the electrons is larger than that of the holes, amounts of the electrons and the holes injected into the recombination region of the light emitting layer are different from each other, resulting in reduction of a luminous efficiency and a life time of the organic light emitting device.

SUMMARY

In view of the above problems existing in the organic light emitting device in the prior art, the embodiments of the application provide an organic light emitting device which have a high luminous efficiency and a long life time, a method of fabricating the organic light emitting device, and a display device.

An embodiment of the application provides an organic light emitting device comprising an anode layer, a cathode layer, and a light emitting layer provided between the anode layer and the cathode layer, the organic light emitting device further comprises a carrier velocity adjustment layer provided between the light emitting layer and at least one of the anode layer and the cathode layer, and the carrier velocity adjustment layer is used for adjusting an injection rate of a carrier.

The carrier velocity adjustment layer may be provided between the light emitting layer and the cathode layer, and the carrier velocity adjustment layer may comprise an electron velocity adjustment layer. The electron velocity adjustment layer comprises a plurality of electron trap units which are provided successively, and the electron trap unit comprises an electron injection sublayer and a deceleration layer which are sequentially provided in a direction away from the cathode layer. The electron injection sublayer is used for injecting electrons into the deceleration layer, and the deceleration layer is used for reducing the injection rate of the electrons.

The carrier velocity adjustment layer may further comprise an electron transport layer provided between the light emitting layer and the electron velocity adjustment layer.

The electron transport layer may comprise a material having an electron mobility larger than $10^{-3}$ cm$^2$/VS.

The material of the electron transport layer may comprise any one of 2-(4-biphenyl)-5-phenyl oxadiazole (PBD), 2,5-bis(1-naphthyl)-1,3,4-oxadiazole (BND), and 2,4,6-triphenyl-1,3,5-triazine (TRZ).

A thickness of the electron transport layer may range from 10 nm to 30 nm.

A material of the deceleration layer may comprise any one of magnesium, silver, aluminum, lithium, potassium and calcium, or an alloy thereof.

A thickness of the deceleration layer may range from 1 nm to 10 nm.

A material of the electron injection sublayer may comprise any one of lithium fluoride, sodium fluoride, potassium fluoride, rubidium fluoride, cesium fluoride, lithium oxide, and lithium metaborate.

A thickness of the electron injection sublayer may range from 1 nm to 5 nm.

The number of the electron trap units may range from two to ten.

The organic light emitting device may further comprise a hole injection layer and a hole transport layer which are provided between the anode layer and the light emitting layer. The hole injection layer is provided between the anode layer and the hole transport layer.

The carrier velocity adjustment layer may be provided between the light emitting layer and the anode layer, and the carrier velocity adjustment layer may comprise a hole velocity adjustment layer. The hole velocity adjustment layer comprises a plurality of hole acceleration units which are provided successively, and the hole acceleration unit comprises a hole injection sublayer and an acceleration layer sequentially provided in a direction away from the anode layer. The hole injection sublayer is used for injecting holes into the acceleration layer, and the acceleration layer is used for increasing a transport rate of the holes.

A material of the hole injection sublayer may be a P-type doped material.

A material of the hole injection sublayer may comprise any one of 2,3,6,7,10,11-hexacyano-1,4,5,8,9,12-hexaazatriphenylne, 2,3,5,6-tetrafluoro-7,7',8,8'-tetracyanoquinodimethane, and tris(4-bromophenyl)aminium hexachloroantimonate.

A thickness of the hole injection sublayer may range from 1 nm to 5 nm.

A material of the acceleration layer may comprise any one of N,N'-bis(1-naphthyl)-N,N'-diphenyl-1,1'-biphenyl-4,4'-diamine, triphenyldiamine derivative, and 1,3,5-tris(N-3-methylphenyl-N-phenylamino) benzene.

A thickness of the acceleration layer may range from 10 nm to 200 nm.

The number of the hole acceleration units may range from two to ten.

The organic light emitting device may further comprise an electron injection layer and an electron transport layer which are provided between the cathode layer and the light emitting layer. The electron transport layer is provided between the light emitting layer and the electron injection layer.

The carrier velocity adjustment layer may comprise a hole velocity adjustment layer and an electron velocity adjustment layer, the hole velocity adjustment layer is provided between the anode layer and the light emitting layer, and the electron velocity adjustment layer is provided between the cathode layer and the light emitting layer. The hole velocity adjustment layer comprises a plurality of hole acceleration units which are provided successively, the hole acceleration unit comprises a hole injection sublayer and an acceleration layer sequentially provided in a direction away from the anode layer, the hole injection sublayer is used for injecting holes into the acceleration layer, and the acceleration layer is used for increasing a transport rate of the holes. The electron velocity adjustment layer comprises a plurality of electron trap units which are provided successively, the electron trap unit comprises an electron injection sublayer and a deceleration layer which are sequentially provided in a direction away from the cathode layer, the electron injection sublayer is used for injecting electrons into the deceleration layer, and the deceleration layer is used for reducing the injection rate of the electrons.

The organic light emitting device may further comprise an electron transport layer provided between the light emitting layer and the electron velocity adjustment layer.

An embodiment of the application further provides a method of fabricating an organic light emitting device, comprising forming an anode layer and a cathode layer on a substrate, and forming a light emitting layer between the cathode layer and the anode layer, and the method further comprises forming a carrier velocity adjustment layer between the light emitting layer and at least one of the anode layer and the cathode layer, The carrier velocity adjustment layer may be formed between the cathode layer and the light emitting layer, and the carrier velocity adjustment layer comprises an electron velocity adjustment layer. The electron velocity adjustment layer comprises a plurality of electron trap units which are provided successively, and the electron trap unit comprises an electron injection sublayer and a deceleration layer which are sequentially provided in a direction away from the cathode layer. The electron injection sublayer is used for injecting electrons into the deceleration layer, and the deceleration layer is used for reducing the injection rate of the electrons. Forming the electron velocity adjustment layer comprises: sequentially forming, by using an evaporation process, the deceleration layer and the electron injection sublayer on the substrate having the light emitting layer formed thereon; and then repeatedly forming the deceleration layer and the electron injection sublayer.

Forming the electron velocity adjustment layer may further comprise forming an electron transport layer between the light emitting layer and the deceleration layer closest to the light emitting layer.

The carrier velocity adjustment layer may be formed between the light emitting layer and the anode layer, and the carrier velocity adjustment layer comprises a hole velocity adjustment layer. The hole velocity adjustment layer comprises a plurality of hole acceleration units which are provided successively, and the hole acceleration unit comprises a hole injection sublayer and an acceleration layer sequentially provided in a direction away from the anode layer. The hole injection sublayer is used for injecting holes into the acceleration layer, and the acceleration layer is used for increasing a transport rate of the holes. Forming the hole velocity adjustment layer comprises: sequentially forming, by using an evaporation process, the hole injection sublayer and the acceleration layer on the substrate having the anode layer formed thereon; and then repeatedly forming the hole injection sublayer and the acceleration layer.

The carrier velocity adjustment layer may comprise a hole velocity adjustment layer and an electron velocity adjustment layer, the hole velocity adjustment layer is formed between the anode layer and the light emitting layer, and the electron velocity adjustment layer is formed between the cathode layer and the light emitting layer. The hole velocity adjustment layer comprises a plurality of hole acceleration units which are provided successively, the hole acceleration unit comprises a hole injection sublayer and an acceleration layer sequentially provided in a direction away from the anode layer, the hole injection sublayer is used for injecting holes into the acceleration layer, and the acceleration layer is used for increasing a transport rate of the holes. The electron velocity adjustment layer comprises a plurality of electron trap units which are provided successively, the electron trap unit comprises an electron injection sublayer and a deceleration layer which are sequentially provided in a direction away from the cathode layer, the electron injection sublayer is used for injecting electrons into the deceleration layer, and the deceleration layer is used for reducing the injection rate of the electrons. Forming the hole velocity adjustment layer comprises: sequentially forming, by using an evaporation process, the hole injection sublayer and the acceleration layer on the substrate having the anode layer formed thereon; and then repeatedly forming the hole injection sublayer and the acceleration layer. Forming the electron velocity adjustment layer comprises: sequentially forming, by using an evaporation process, the deceleration layer and the electron injection sublayer on the substrate having the light emitting layer formed thereon; and then repeatedly forming the deceleration layer and the electron injection sublayer.

Forming the electron velocity adjustment layer may further comprise forming an electron transport layer between the light emitting layer and the deceleration layer closest to the light emitting layer.

An embodiment of the application further provides a display device, comprising the organic light emitting device described above.

The carrier velocity adjustment layer is provided in the organic light emitting device of the embodiments of the application, and the carrier velocity adjustment layer is provided between the light emitting layer and at least one of the anode layer and the cathode layer. The carrier velocity adjustment layer may adjust the injection rate of corresponding carrier into the light emitting layer, so that the injection rates of different carriers tend to be balanced, thereby improving the luminous efficiency and the life time of the organic light emitting device.

DETAILED DESCRIPTION

To make the persons skilled in the art better understand the technical solutions of the application, the application will be described in detail below, in conjunction with drawings and specific embodiments.

An embodiment of the application provides an organic light emitting device, comprising an anode layer, a cathode layer, and a light emitting layer provided between the anode layer and the cathode layer. The organic light emitting device further comprises a carrier velocity adjustment layer that is provided between the light emitting layer and at least one of the anode layer and the cathode layer. The carrier velocity adjustment layer is used for adjusting an injection rate of a carrier.

In the existing organic light emitting device, when the organic light emitting device is driven to emit light, since the injection rate of the holes injected from the anode layer to the light emitting layer is different from that of the electrons injected from the cathode layer to the light emitting layer, i.e., the injection rate of the holes is smaller than that of the electrons, amounts of the electrons and the holes injected into the recombination region of the light emitting layer at the same time are different from each other, thus resulting in reduction of the luminous efficiency and the life time of the organic light emitting device.

In the organic light emitting device of the embodiment, the carrier velocity adjustment layer is added, and is provided between the light emitting layer and at least one of the anode layer and the cathode layer. The carrier velocity adjustment layer may adjust the injection rate of corresponding carrier into the light emitting layer, so that the injection rates of different carriers tend to be balanced, thus improving the luminous efficiency and the life time of the organic light emitting device.

Figure 1:
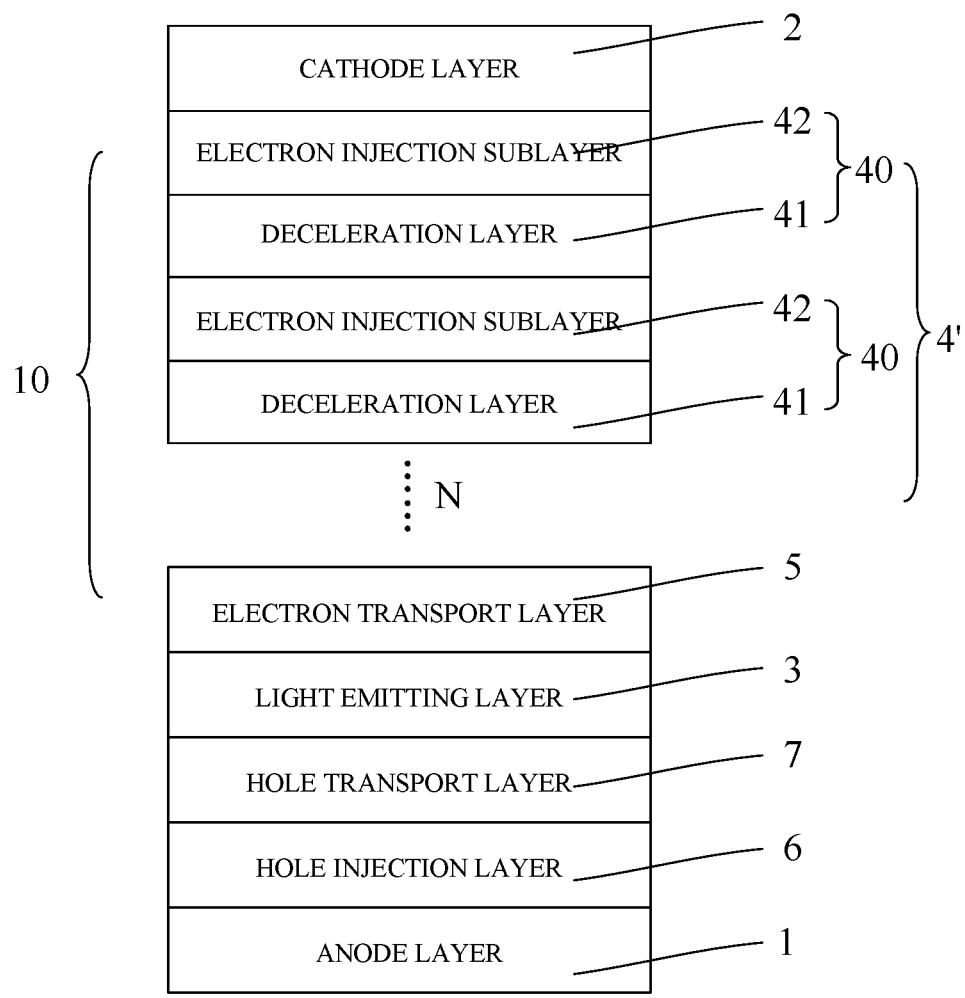
FIG. 1 is a structural schematic diagram of an organic light emitting device according to an embodiment of the application.

Specifically, FIG. 1 illustrates a structural schematic diagram of an organic light emitting device according to an embodiment of the application. The organic light emitting device comprises an anode layer 1, a light emitting layer 3, a carrier velocity adjustment layer 10 and a cathode layer 2. The carrier velocity adjustment layer 10 of the embodiment comprises at least an electron velocity adjustment layer 4'. The electron velocity adjustment layer 4' comprises a plurality of electron trap units 40 which are provided successively, and each of the electron trap units 40 comprises an electron injection sublayer 42 and a deceleration layer 41 which are sequentially provided in a direction away from the cathode layer 2. The electron injection sublayer 42 is used for injecting the electrons into the deceleration layer 41, and the deceleration layer 41 is used for reducing the injection rate of the electrons.

When an external voltage is applied to the organic light emitting device, the electrons injected from the cathode layer 2 pass through the first electron injection sublayer 42 first, an injection capability of the electron itself is poor, and the electron injection sublayer 42 facilitates injection of the electrons. Then, the electrons pass through the first deceleration layer 41, and the injection rate of the electrons is reduced. Afterwards, the electrons pass through the repeated electron injection sublayer 42 and deceleration layer 41. Each group of the electron injection sublayer 42 and the deceleration layer 41 substantially corresponds to the electron trap unit 40 for reducing the injection rate of the electrons. The number of the electron trap units 40 is adjusted such that the injection rate of the electrons and the injection rate of the holes injected from the anode layer 1 tend to be balanced, and the electrons and the holes are recombined to emit light in the light emitting layer 3 at this point. The technical solution of the embodiment facilitates improvement of the luminous efficiency and the life time of the organic light emitting device.

For example, the carrier velocity adjustment layer 10 of the embodiment further comprises an electron transport layer 5 provided between the light emitting layer 3 and the electron velocity adjustment layer 4'. The electron transport layer 5 facilitates transport of the electrons to the light emitting layer 3.

For example, the organic light emitting device of the embodiment further comprises a hole injection layer 6 and a hole transport layer 7 which are provided between the anode layer 1 and the light emitting layer 3. The hole injection layer 6 is provided between the anode layer 1 and the hole transport layer 7. The hole injection layer 6 facilitates improvement of the injection capability of the holes, and the hole transport layer 7 facilitates improvement of the transport capability of the holes to the light emitting layer 3.

Materials and thicknesses of the layers of the above organic light emitting device are described in detail in conjunction with a method of fabricating the organic light emitting device described below.

The method of fabricating the organic light emitting device of the embodiment comprises the following steps S1 to S8.

Step S1 comprises sputtering an anode conductive film on a substrate, and forming a pattern comprising the anode layer 1 by a patterning process.

In this embodiment, the substrate serves as a support for electrode layers and organic function film layers in the organic light emitting device, has a good light transmission property in the visible light region, a certain capability of preventing water vapor and oxygen permeation, and a good surface smoothness, and may be generally formed from glass, a flexible substrate or an array substrate. If the flexible substrate is selected, the substrate may be made of polyester, polyphthalimide or thin metal.

In addition, the anode layer 1 serves as a connection layer for a positive voltage in the organic light emitting device, and has a good conductivity, a light transmission property in the visible light region and a high work function. The anode layer 1 may be made of an inorganic metal oxide (e.g., indium tin oxide (ITO), zinc oxide (ZnO), etc.), an organic conductive polymer (e.g., poly(3,4-ethylenedioxythiophene):polystyrene sulfonate (PEDOT:PSS), polyaniline (PANI), etc.) or a metal material with high work function (e.g., gold, copper, silver, platinum, etc.). The thickness of the anode layer 1 may range from 10 nm to 200 nm.

Step S2 comprises forming, by using a vacuum evaporation process, the hole injection layer 6 on the substrate having the anode layer 1 formed thereon.

In this embodiment, the material of the hole injection layer 6 may comprise any one of 2,3,6,7,10,11-hexacyano-1,4,5,8,9,12-hexaazatriphenylene (HAT-CN), 2,3,5,6-tetrafluoro-7,7',8,8'-tetracyanoquinodimethane ($F_4$-TCNQ), and tris(4-bromophenyl)aminium hexachloroantimonate (TBAHA). The thickness of the hole injection layer 6 may range from 1 nm to 5 nm.

Step S3 comprises forming, by using a vacuum evaporation process, the hole transport layer 7 on the substrate having the hole injection layer 6 formed thereon.

In this embodiment, the hole transport layer 7 may comprise the material having a hole mobility larger than $10^{-5}$ cm$^2$/VS, and may be made of aromatic diamine compound, triphenylamine compound, aromatic triamine compound, biphenyl diamine derivatives, triarylamine polymer, metal complex, or carbazole-based polymer, for example, any one of N,N'-bis(1-naphthyl)-N,N'-diphenyl-1,1'-biphenyl-4,4'-diamine (NPB), triphenyldiamine derivative (TPD), TPTE, and 1,3,5-tris(N-3-methylphenyl-N-phenylamino) benzene (TDAB). The thickness of the hole transport layer 7 may range from 10 nm to 200 nm.

Step S4 comprises forming, by using a vacuum evaporation process, the light emitting layer 3 on the substrate having the hole transport layer 7 formed thereon.

In this embodiment, the light emitting layer 3 may be made of a non-doped fluorescent organic material consisting of a luminescent material having a hole transport capability not lower than an electron transport capability, or may be made of a fluorescent material-doped organic material consisting of a fluorescent dopant and a host material, or may be made of a phosphorescent material-doped organic material consisting of a phosphorescent dopant and a host material. The thickness of the light emitting layer 3 may range from 10 nm to 50 nm.

Step S5 comprises forming, by using a vacuum evaporation process, the electron transport layer 5 on the substrate having the light emitting layer 3 formed thereon.

In this embodiment, the electron transport layer 5 may comprise the material having an electron mobility larger than $10^{-3}$ cm$^2$/VS.

For example, the material of the electron transport layer 5 may comprise any one of 2-(4-biphenyl)-5-phenyl oxadiazole (PBD), 2,5-bis(1-naphthyl)-1,3,4-oxadiazole (BND), and 2,4,6-triphenyl-1,3,5-triazine (TRZ).

For example, the thickness of the electron transport layer 5 may range from 10 nm to 30 nm.

Step S6 comprises forming, by using a vacuum evaporation process, the first deceleration layer 41 on the substrate having the electron transport layer 5 formed thereon.

In this embodiment, the material of the deceleration layer 41 may comprise any one of magnesium (Mg), silver (Ag), aluminum (Al), lithium (Li), potassium (K) and calcium (Ca), or an alloy thereof. The thickness of the deceleration layer 41 may range from 1 nm to 10 nm.

Step S7 comprises forming, by using a vacuum evaporation process, the first electron injection sublayer 42 on the substrate having the first deceleration layer 41 formed thereon.

In this embodiment, the material of the electron injection sublayer 42 may comprise any one of lithium fluoride, sodium fluoride, potassium fluoride, rubidium fluoride, cesium fluoride, lithium oxide, and lithium metaborate. The thickness of the electron injection sublayer 42 may range from 1 nm to 5 nm.

Then, steps S6 and S7 are repeated, i.e., the plurality of electron trap units 40 are formed. The number of the electron trap units 40 may range from two to ten, e.g., may be three. Of course, the number may be set according to a specific situation.

Step S8 comprises forming, by using a vacuum evaporation process, the cathode layer 2 on the substrate having the N-th electron injection sublayer 42 formed thereon.

In this embodiment, the cathode layer 2 serves as a connection layer for a negative voltage in the organic light emitting device, and has a good conductivity and a low work function. The cathode layer 2 may be generally made of a metal material with low work function, e.g., lithium, magnesium, calcium, strontium, aluminum, indium, etc., or an alloy of the above metal with copper, gold or silver, or may be formed of a thin layer of buffer insulation layer (e.g., lithium fluoride LiF, cesium carbonate $CsCO_3$, etc.) and the above metal or alloy. The thickness of the cathode layer 2 may range from 10 nm to 20 nm.

Thus, the fabrication of the organic light emitting device of the embodiment is completed.

Figure 2:
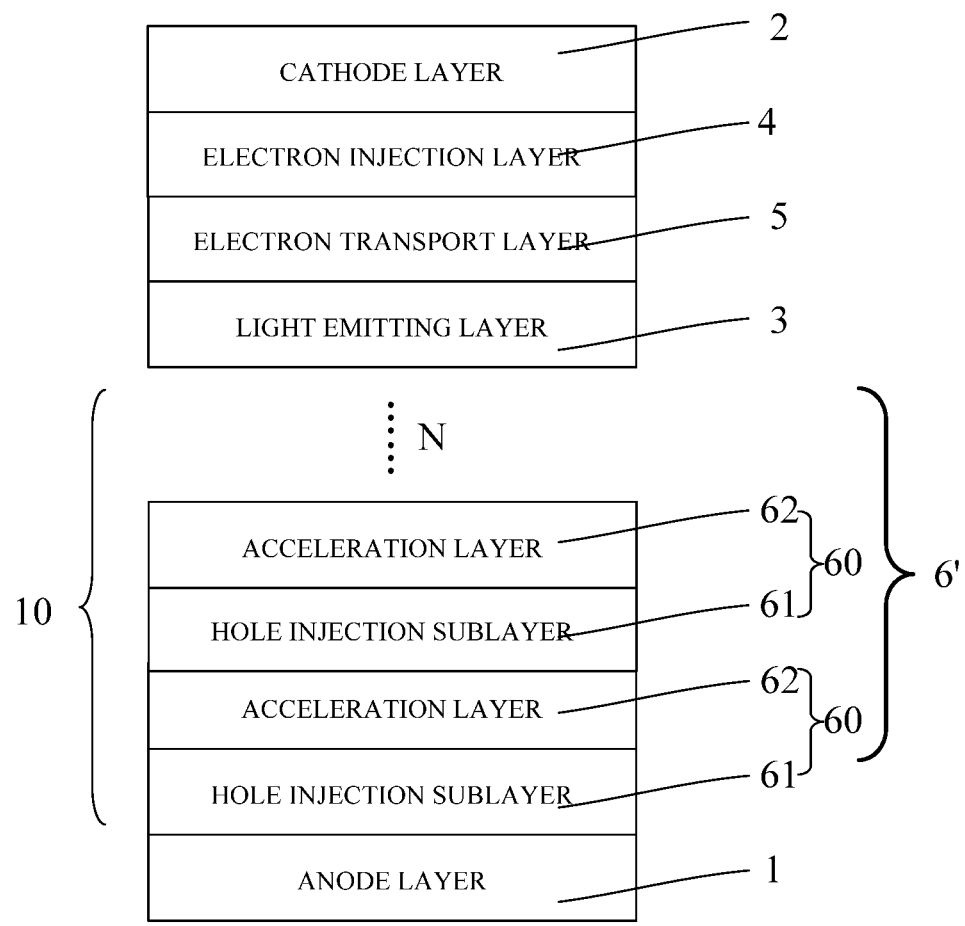
FIG. 2 is a structural schematic diagram of an organic light emitting device according to an embodiment of the application.

FIG. 2 illustrates a structural schematic diagram of an organic light emitting device according to an embodiment of the application. The organic light emitting device comprises a substrate, and an anode layer 1, a carrier velocity adjustment layer 10, a light emitting layer 3 and a cathode layer 2 which are sequentially provided on the substrate. The carrier velocity adjustment layer 10 of the embodiment comprises a hole velocity adjustment layer 6'. The hole velocity adjustment layer 6' comprises a plurality of hole acceleration units 60 which are provided successively, and each of the hole acceleration units 60 comprises a hole injection sublayer 61 and an acceleration layer 61 sequentially provided in a direction away from the anode layer 1. The hole injection sublayer 61 is used for injecting the holes into the acceleration layer 62, and the acceleration layer 62 is used for increasing the injection rate of the holes.

In this embodiment, since the carrier velocity adjustment layer 10 is provided between the anode layer 1 and the light emitting layer 3, the carrier velocity adjustment layer 10 can increase the injection rate of the holes. Specifically, the carrier velocity adjustment layer 10 comprises the hole velocity adjustment layer 6' that consists of the plurality of hole acceleration units 60. When an external voltage is applied to the organic light emitting device, the holes injected from the anode layer 1 into the light emitting layer 3 pass through one hole acceleration unit 60, and the injection rate of the holes is increased. The number of the hole acceleration units 60 is adjusted such that the injection rate of the electrons and the injection rate of the holes tend to be balanced, and the electrons and the holes are recombined to emit light in the light emitting layer 3 at this point. The technical solution of the embodiment facilitates improvement of the luminous efficiency and the life time of the organic light emitting device.

For example, the organic light emitting device of the embodiment further comprises an electron injection layer 4 and an electron transport layer 5 which are provided between the cathode layer 2 and the light emitting layer 3. The electron transport layer 5 is provided between the light emitting layer 3 and the electron injection layer 4. The electron injection layer 4 and the electron transport layer 5 facilitate improvement of the capability of injecting the electrons from the cathode layer 2 into the light emitting layer 3.

Materials and thicknesses of the layers of the above organic light emitting device are described in detail in conjunction with a method of fabricating the organic light emitting device described below.

The method of fabricating the organic light emitting device of the embodiment comprises the following steps S1 to S7.

Step S1 comprises sputtering an anode conductive film on a substrate, and forming a pattern comprising the anode layer 1 by a patterning process.

In this embodiment, the substrate serves as a support for electrode layers and organic function film layers in the organic light emitting device, has a good light transmission property in the visible light region, a certain capability of preventing water vapor and oxygen permeation, and a good surface smoothness, and may be generally formed from glass, a flexible substrate or an array substrate. If the flexible substrate is selected, the substrate may be made of polyester, polyphthalimide or thin metal.

In addition, the anode layer 1 serves as a connection layer for a positive voltage in the organic light emitting device, and has a good conductivity, a light transmission property in the visible light region and a high work function. The anode layer 1 may be made of an inorganic metal oxide (e.g., indium tin oxide (ITO), zinc oxide (ZnO), etc.), an organic conductive polymer (e.g., poly(3,4-ethylenedioxythiophene):polystyrene sulfonate (PEDOT:PSS), polyaniline (PANI), etc.) or a metal material with high work function (e.g., gold, copper, silver, platinum, etc.). The thickness of the anode layer 1 may range from 10 nm to 200 nm.

Step S2 comprises forming, by using a vacuum evaporation process, the hole injection sublayer 61 of the first hole acceleration unit 60 on the substrate having the anode layer 1 formed thereon.

In this embodiment, the hole injection sublayer 61 may be made of an organic material or polymer doped with a phosphorescent dopant (P).

For example, the material of the hole injection sublayer 61 may comprise any one of 2,3,6,7,10,11-hexacyano-1,4,5,8,9,12-hexaazatriphenylene (HAT-CN), 2,3,5,6-tetrafluoro-7,7',8,8'-tetracyanoquinodimethane ($F_4$-TCNQ), and tris(4-bromophenyl)aminium hexachloroantimonate (TBAHA). The thickness of the hole injection sublayer 61 may range from 1 nm to 5 nm, e.g., may be 1 nm.

Step S3 comprises forming, by using a vacuum evaporation process, the acceleration layer 62 on the substrate having the hole injection sublayer 61 of the first hole acceleration unit 60 formed thereon.

In this embodiment, the acceleration layer 62 may comprise the material having a hole mobility larger than $10^{-5}$ cm$^2$/VS.

Specifically, the acceleration layer 62 may be made of aromatic diamine compound, triphenylamine compound, aromatic triamine compound, biphenyl diamine derivatives, triarylamine polymer, metal complex, or carbazole-based polymer, for example, any one of N,N'-bis(1-naphthyl)-N,N'-diphenyl-1,1'-biphenyl-4,4'-diamine (NPB), triphenyl-diamine derivative (TPD), TPTE, and 1,3,5-tris(N-3-methylphenyl-N-phenylamino) benzene (TDAB). The thickness of the acceleration layer 62 may range from 10 nm to 200 nm.

Then, steps S2 and S3 are repeated to form the plurality of hole acceleration units 60. The number of the hole acceleration units 60 may range from two to ten, e.g., may be three. Of course, the number may be set according to a specific situation, so that the injection rate of the holes and the injection rate of the electrons tend to be balanced.

Step S4 comprises forming, by using a vacuum evaporation process, the light emitting layer 3 on the substrate having the hole velocity adjustment layer 6' formed thereon.

In this embodiment, the light emitting layer 3 may be made of a non-doped fluorescent organic material consisting of a luminescent material having a hole transport capability not lower than an electron transport capability, or may be made of a fluorescent material-doped organic material consisting of a fluorescent dopant and a host material, or may be made of a phosphorescent material-doped organic material consisting of a phosphorescent dopant and a host material. The thickness of the light emitting layer 3 may range from 10 nm to 50 nm.

Step S5 comprises forming, by using a vacuum evaporation process, the electron transport layer 5 on the substrate having the light emitting layer 3 formed thereon.

In this embodiment, the electron transport layer 5 may comprise the material having a high electron mobility, for example, any one of 2-(4-biphenyl)-5-phenyl oxadiazole (PBD), 2,5-bis(1-naphthyl)-1,3,4-oxadiazole (BND), and 2,4,6-triphenyl-1,3,5-triazine (TRZ). The thickness of the electron transport layer 5 may range from 10 nm to 30 nm.

Step S6 comprises forming, by using a vacuum evaporation process, the electron injection layer 4 on the substrate having the electron transport layer 5 formed thereon.

In this embodiment, the material of the electron injection layer 4 may comprise any one of lithium fluoride, sodium fluoride, potassium fluoride, rubidium fluoride, cesium fluoride, lithium oxide, and lithium metaborate. The thickness of the electron injection layer 4 may range from 1 nm to 5 nm.

Step S7 comprises forming, by using a vacuum evaporation process, the cathode layer 2 on the substrate having the electron injection layer 4 formed thereon.

In this embodiment, the cathode layer 2 serves as a connection layer for a negative voltage in the organic light emitting device, and has a good conductivity and a low work function. The cathode layer 2 may be generally made of a metal material with low work function, e.g., lithium, magnesium, calcium, strontium, aluminum, indium, etc., or an alloy of the above metal with copper, gold or silver, or may be formed of a thin layer of buffer insulation layer (e.g., lithium fluoride LiF, cesium carbonate $CsCO_3$, etc.) and the above metal or alloy. The thickness of the cathode layer 2 may range from 10 nm to 20 nm.

Thus, the fabrication of the organic light emitting device of the embodiment is completed.

Figure 3:
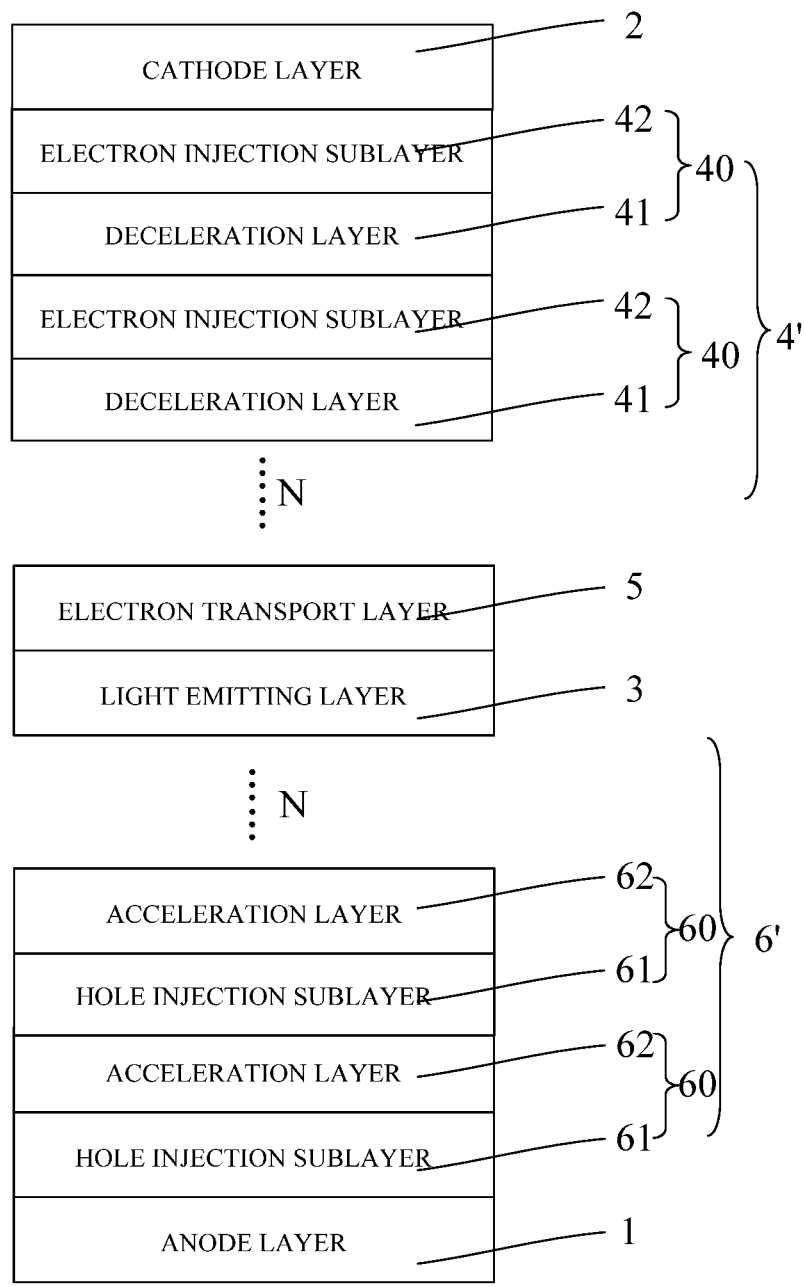
FIG. 3 is a structural schematic diagram of an organic light emitting device according to an embodiment of the application.

FIG. 3 illustrates a structural schematic diagram of an organic light emitting device according to an embodiment of the application. The organic light emitting device comprises an anode layer 1, a hole velocity adjustment layer 6', a light emitting layer 3, an electron velocity adjustment layer 4' and a cathode layer 2. The hole velocity adjustment layer 6' and the electron velocity adjustment layer 4' constitute a carrier velocity adjustment layer. The hole velocity adjustment layer 6' comprises a plurality of hole acceleration units 60 which are provided successively, and each of the hole acceleration units 60 comprises a hole injection sublayer 61 and an acceleration layer 61 sequentially provided in a direction away from the anode layer 1. The hole injection sublayer 61 is used for injecting the holes into the acceleration layer 62, and the acceleration layer 62 is used for increasing the injection rate of the holes. The electron velocity adjustment layer 4' comprises a plurality of electron trap units 40 which are provided successively, and each of the electron trap units 40 comprises an electron injection sublayer 42 and a deceleration layer 41 sequentially provided in a direction away from the cathode layer 2. The electron injection sublayer 42 is used for injecting the electrons into the deceleration layer 41, and the deceleration layer 41 is used for reducing the injection rate of the electrons.

When an external voltage is applied to the organic light emitting device, the electrons injected from the cathode layer 2 pass through the first electron injection sublayer 42 of the electron velocity adjustment layer 4' first, an injection capability of the electron itself is poor, and the electron injection sublayer 42 facilitates injection of the electrons. Then, the electrons pass through the first deceleration layer 41, and the injection rate of the electrons is reduced. Afterwards, the electrons pass through the repeated electron injection sublayer 42 and deceleration layer 41. Each group of the electron injection sublayer 42 and the deceleration layer 41 substantially corresponds to the electron trap unit 40 for reducing the injection rate of the electrons. Meanwhile, the hole velocity adjustment layer 6' consists of the plurality of hole acceleration units 60. When an external voltage is applied to the organic light emitting device, the holes injected from the anode layer 1 into the light emitting layer 3 pass through the hole acceleration unit 60, and the injection rate of the holes is increased. The number of the electron trap units 40 and the number of the hole acceleration units 60 are adjusted such that the injection rate of the electrons and the injection rate of the holes tend to be balanced, and the electrons and the holes are recombined to emit light in the light emitting layer 3 at this point. The organic light emitting device according to the embodiment of the application has improved luminous efficiency and life time.

For example, the organic light emitting device of the embodiment further comprises an electron transport layer 5 provided between the light emitting layer 3 and the electron velocity adjustment layer 4'. The electron transport layer 5 facilitates transport of the electrons to the light emitting layer 3.

Materials and thicknesses of the layers of the above organic light emitting device are described in detail in conjunction with a method of fabricating the organic light emitting device described below.

The method of fabricating the organic light emitting device of the embodiment comprises the following steps S1 to S8.

Step S1 comprises sputtering an anode conductive film on a substrate, and forming a pattern comprising the anode layer 1 by a patterning process.

In this embodiment, the substrate serves as a support for electrode layers and organic function film layers in the organic light emitting device, has a good light transmission property in the visible light region, a certain capability of preventing water vapor and oxygen permeation, and a good surface smoothness, and may be generally formed from glass, a flexible substrate or an array substrate. If the flexible substrate is selected, the substrate may be made of polyester, polyphthalimide or thin metal.

In addition, the anode layer 1 serves as a connection layer for a positive voltage in the organic light emitting device, and has a good conductivity, a light transmission property in the visible light region and a high work function. The anode layer 1 may be made of an inorganic metal oxide (e.g., indium tin oxide (ITO), zinc oxide (ZnO), etc.), an organic conductive polymer (e.g., poly (3,4-ethylenedioxythiophene)/polystyrene sulfonate (PEDOT:PSS), polyaniline (PANI), etc.) or a metal material with high work function (e.g., gold, copper, silver, platinum, etc.). The thickness of the anode layer 1 may range from 10 nm to 200 nm.

Step S2 comprises forming, by using a vacuum evaporation process, the hole injection sublayer 61 of the first hole acceleration unit 60 on the substrate having the anode layer 1 formed thereon.

In this embodiment, the hole injection sublayer 61 may be made of an organic material or polymer doped with a phosphorescent dopant (P). For example, the hole injection sublayer 61 may be made of any one of 2,3,6,7,10,11-hexacyano-1,4,5,8,9,12-hexaazatriphenylene (HAT-CN), 2,3,5,6-tetrafluoro-7,7',8,8'-tetracyanoquinodimethane ($F_4$-TCNQ), and tris(4-bromophenyl)aminium hexachloroantimonate (TBAHA). The thickness of the hole injection sublayer 61 may range from 1 nm to 5 nm, e.g., may be 1 nm.

Step S3 comprises forming, by using a vacuum evaporation process, the acceleration layer 62 on the substrate having the hole injection sublayer 61 of the first hole acceleration unit 60 formed thereon.

In this embodiment, the acceleration layer 62 may comprise the material having a hole transport rate larger than $10^{-5}$ cm$^2$/VS, and may be made of aromatic diamine compound, triphenylamine compound, aromatic triamine compound, biphenyl diamine derivatives, triarylamine polymer, metal complex, or carbazole-based polymer, for example, any one of N,N'-bis(1-naphthyl)-N,N'-diphenyl-1,1'-biphenyl-4,4'-diamine (NPB), triphenyldiamine derivative (TPD), TPTE, and 1,3,5-tris(N-3-methylphenyl-N-phenylamino)benzene (TDAB). The thickness of the acceleration layer 62 may range from 10 nm to 200 nm.

Then, steps S2 and S3 are repeated to form the plurality of hole acceleration units 60. The number of the hole acceleration units 60 may range from two to ten, e.g., may be three. Of course, the number may be set according to a specific situation, so that the injection rate of the holes and the injection rate of the electrons tend to be balanced.

Step S4 comprises forming, by using a vacuum evaporation process, the light emitting layer 3 on the substrate having the hole velocity adjustment layer 6' formed thereon.

In this embodiment, the light emitting layer 3 may be made of a non-doped fluorescent organic material consisting of a luminescent material having a hole transport capability not lower than an electron transport capability, or may be made of a fluorescent material-doped organic material consisting of a fluorescent dopant and a host material, or may be made of a phosphorescent material-doped organic material consisting of a phosphorescent dopant and a host material. The thickness of the light emitting layer 3 may range from 10 nm to 50 nm.

Step S5 comprises forming, by using a vacuum evaporation process, the electron transport layer 5 on the substrate having the light emitting layer 3 formed thereon.

In this embodiment, the electron transport layer 5 may comprise the material having a high electron mobility, for example, any one of 2-(4-biphenyl)-5-phenyl oxadiazole (PBD), 2,5-bis(1-naphthyl)-1,3,4-oxadiazole (BND), and 2,4,6-triphenyl-1,3,5-triazine (TRZ). The thickness of the electron transport layer 5 may range from 10 nm to 30 nm.

Step S6 comprises forming, by using a vacuum evaporation process, the first deceleration layer 41 on the substrate having the electron transport layer 5 formed thereon.

In this embodiment, the material of the deceleration layer 41 may comprise any one of magnesium (Mg), silver (Ag), aluminum (Al), lithium (Li), potassium (K) and calcium (Ca), or an alloy thereof. The thickness of the deceleration layer 41 may range from 1 nm to 10 nm.

Step S7 comprises forming, by using a vacuum evaporation process, the first electron injection sublayer 42 on the substrate having the first deceleration layer 41 formed thereon.

In this embodiment, the material of the electron injection sublayer 42 may comprise any one of lithium fluoride, sodium fluoride, potassium fluoride, rubidium fluoride, cesium fluoride, lithium oxide, and lithium metaborate. The thickness of the electron injection sublayer 42 may range from 1 nm to 5 nm.

Then, steps S6 and S7 are repeated, i.e., the plurality of electron trap units 40 are formed. For example, the number of the electron trap units 40 may be three. Of course, the number may be set according to a specific situation, as long as the injection rate of the electrons and the injection rate of the holes are guaranteed to be substantially the same.

Step S8 comprises forming, by using a vacuum evaporation process, the cathode layer 2 on the substrate having the N-th electron injection sublayer 42 formed thereon.

In this embodiment, the cathode layer 2 serves as a connection layer for a negative voltage in the organic light emitting device, and has a good conductivity and a low work function. The cathode layer 2 may be generally made of a metal material with low work function, e.g., lithium, magnesium, calcium, strontium, aluminum, indium, etc., or an alloy of the above metal with copper, gold or silver, or may be formed of a thin layer of buffer insulation layer (e.g., lithium fluoride LiF, cesium carbonate $CsCO_3$, etc.) and the above metal or alloy. The thickness of the cathode layer 2 may range from 10 nm to 20 nm.

Thus, the fabrication of the organic light emitting device of the embodiment is completed.

An embodiment of the application further provides a display device that comprises any one of the above organic light emitting devices. The display device of the embodiment has a good luminous efficiency and a good life time.

The display device may be any product or component with a display function, such as an electronic paper, an OLED panel, a mobile phone, a tablet computer, a TV set, a display, a laptop, a digital photo frame, a navigator, etc.

It should be understood that the above embodiments are only exemplary embodiments for illustrating the principle of the application, but the application is not limited thereto. Various variations and improvements can be made by the person of ordinary skill in the art without departing from the spirit and essence of the application, and these variations and improvements should also be considered to fall within the protection scope of the application.

What is claimed is:

1. An organic light emitting device, comprising an anode layer, a light emitting layer, and a cathode layer that are provided successively on a substrate along a direction from the substrate to the cathode layer, wherein
the organic light emitting device further comprises an electron velocity adjustment layer provided between the light emitting layer and the cathode layer, and
the electron velocity adjustment layer comprises a deceleration layer, and
the deceleration layer is used for reducing an injection rate of the electrons,
wherein the electron velocity adjustment layer comprises a plurality of electron trap units which are provided successively, and each of the electron trap units comprises an electron injection sublayer and the deceleration layer which are sequentially provided in a direction from the cathode layer to the anode layer; and
the electron injection sublayer is used for injecting electrons into the deceleration layer.

2. The organic light emitting device of claim 1, further comprising an electron transport layer provided between the light emitting layer and the electron velocity adjustment layer.

3. The organic light emitting device of claim 2, wherein the electron transport layer comprises a material having an electron mobility larger than $10^{-3}$ $cm^2/VS$.

4. The organic light emitting device of claim 3, wherein the material of the electron transport layer comprises any one of 2-(4-biphenyl)-5-phenyl oxadiazole, 2,5-bis(1-naphthyl)-1,3,4-oxadiazole, and 2,4,6-triphenyl-1,3,5-triazine.

5. The organic light emitting device of claim 2, wherein a thickness of the electron transport layer ranges from 10 nm to 30 nm.

6. The organic light emitting device of claim 1, wherein a material of the deceleration layer comprises any one of magnesium, silver, aluminum, lithium, potassium and calcium, or an alloy thereof.

7. The organic light emitting device of claim 1, wherein a thickness of the deceleration layer ranges from 1 nm to 10 nm.

8. The organic light emitting device of claim 1, wherein a material of the electron injection sublayer comprises any one of lithium fluoride, sodium fluoride, potassium fluoride, rubidium fluoride, cesium fluoride, lithium oxide, and lithium metaborate.

9. The organic light emitting device of claim 1, wherein a thickness of the electron injection sublayer ranges from 1 nm to 5 nm.

10. The organic light emitting device of claim 1, wherein the number of the electron trap units ranges from two to ten.

11. The organic light emitting device of claim 1, further comprising a hole injection layer and a hole transport layer which are provided between the anode layer and the light emitting layer, wherein
the hole injection layer is provided between the anode layer and the hole transport layer.

12. An organic light emitting device, comprising an anode layer, a cathode layer, and a light emitting layer provided between the anode layer and the cathode layer, wherein
the organic light emitting device further comprises a carrier velocity adjustment layer provided between the light emitting layer and at least one of the anode layer and the cathode layer, and
the carrier velocity adjustment layer is used for adjusting an injection rate of a carrier,
the carrier velocity adjustment layer is provided between the light emitting layer and the anode layer, the carrier velocity adjustment layer comprises a hole velocity adjustment layer;
the hole velocity adjustment layer comprises a plurality of hole acceleration units which are provided successively, and each of the hole acceleration units comprises a hole injection sublayer and an acceleration layer sequentially provided in a direction from the anode layer to the cathode layer; and
the hole injection sublayer is used for injecting holes into the acceleration layer, and the acceleration layer is used for increasing a transport rate of the holes.

13. The organic light emitting device of claim 12, wherein a material of the hole injection sublayer is a P-type doped material.

14. The organic light emitting device of claim 13, wherein a material of the hole injection sublayer comprises any one of 2,3,6,7,10,11-hexacyano-1,4,5,8,9,12-hexaazatriphenylene, 2,3,5,6-tetrafluoro-7,7',8,8'-tetracyanoquinodimethane, and tris(4-bromophenyl)aminium hexachloroantimonate.

15. The organic light emitting device of claim 12, wherein a thickness of the hole injection sublayer ranges from 1 nm to 5 nm.

16. The organic light emitting device of claim 12, wherein a material of the acceleration layer comprises any one of N,N-bis(1-naphthyl)-N,N'-diphenyl-1,1'-biphenyl-4,4'-diamine, triphenyldiamine derivative, and 1,3,5-tris(N-3-methylphenyl-N-phenylamino) benzene.

17. The organic light emitting device of claim 12, wherein a thickness of the acceleration layer ranges from 10 nm to 200 nm.

18. The organic light emitting device of claim 12, wherein the number of the hole acceleration units ranges from two to ten.

19. The organic light emitting device of claim 12, further comprising an electron injection layer and an electron transport layer which are provided between the cathode layer and the light emitting layer, wherein
the electron transport layer is provided between the light emitting layer and the electron injection layer.

20. The organic light emitting device of claim 1, further comprising a hole velocity adjustment layer, the hole velocity adjustment layer is provided between the anode layer and the light emitting layer;
the hole velocity adjustment layer comprises a plurality of hole acceleration units which are provided successively, each of the hole acceleration units comprises a hole injection sublayer and an acceleration layer sequentially provided in a direction from the anode layer to the cathode layer, the hole injection sublayer is used for injecting holes into the acceleration layer, and the acceleration layer is used for increasing a transport rate of the holes.

21. The organic light emitting device of claim 20, further comprising an electron transport layer provided between the light emitting layer and the electron velocity adjustment layer.

* * * * *